United States Patent
Kobatake

[11] Patent Number: 5,966,328
[45] Date of Patent: Oct. 12, 1999

[54] NONVOLATILE SEMICONDUCTOR MEMORY DEVICE HAVING A PROGRAM AREA

[75] Inventor: Hiroyuki Kobatake, Tokyo, Japan

[73] Assignee: NEC Corporation, Tokyo, Japan

[21] Appl. No.: 09/252,231

[22] Filed: Feb. 18, 1999

[30] Foreign Application Priority Data

Feb. 18, 1998 [JP] Japan .................................. 10-035302

[51] Int. Cl.[6] .................................................. G11C 7/00
[52] U.S. Cl. ................................ 365/185.14; 365/185.18; 365/185.24
[58] Field of Search ......................... 365/185.14, 185.18, 365/185.24, 185.27

[56] References Cited

U.S. PATENT DOCUMENTS 5,138,576 8/1992 Madurawe ......................... 365/185.14
5,245,566 9/1993 Masuoka ............................ 365/185.14

FOREIGN PATENT DOCUMENTS 7-288291 10/1995 Japan .

*Primary Examiner*—Vu A. Le
*Attorney, Agent, or Firm*—Foley & Lardner

[57] ABSTRACT

A flash EEPROM includes a an array of nonvolatile memory cells each having a cell transistor of a double gate structure and a program area for the floating gate of the cell transistor. The flash EEPROM is subjected to programming, flash erasing and read mode, each of a byte by byte mode. The flash EEPROM includes first through third selection transistors, for disconnecting the source, drain and control gate of the selected cell transistor from those of the unselected cell transistors in a byte for suppressing a disturbance between cell transistors.

8 Claims, 15 Drawing Sheets

|  | BL | GL | WL | DL |
|---|---|---|---|---|
| PROGRAMMING | Vpp | 0V | Vpp | Open |
| ERASING | 0V | Vpp | Vpp | Open |
| READ | 1V | 0V | Vdd | 0V |

|  | DGL | BL | WL | PL |
|---|---|---|---|---|
| PROGRAMMING | 0V | Open | 0V | Vpp |
| ERASING | Vpp | Open | 0V | 0V |
| READ | 0V | 1V | Vdd | 0V |

|  | BL | PL | WL | DGL |
|---|---|---|---|---|
| PROGRAMMING | 0V | Vpp | Vpp | 0V |
| ERASING | Vpp | 0V | Vpp | Vpp |
| READ | 0V | 1V | Vdd | 0V |

FIG. 18

|  | BL | PL | WL | GL | DL |
|---|---|---|---|---|---|
| PROGRAMMING | 0V | Vpp | Vpp | 0V | 0V |
| ERASING | Vpp' | 0V | Vpp | Vpp | Vpp' |
| READ | 0V | 1V | Vdd | 0.5V | 0V |

NONVOLATILE SEMICONDUCTOR MEMORY DEVICE HAVING A PROGRAM AREA

BACKGROUND OF THE INVENTION (a) Field of the Invention

The present invention relates to a nonvolatile semiconductor memory device, such as a flash EEPROM., and more particularly, to a nonvolatile semiconductor memory device having a program area in each memory cell.

(b) Description of the Related Art

A flash EEPROM is known in the art having a memory cell array including a plurality of nonvolatile memory cells arranged in a matrix and each having a double layer gate structure. Referring to FIG. 1 showing a schematic sectional view of a memory cell in a conventional EEPROM, the memory cell includes a floating gate FG formed on a semiconductor substrate having source and drain regions "S" and "D", with an intervention of a gate oxide film not shown, and a control electrode CG formed on the floating electrode FG with an intervention of another oxide film not shown.

In programming of the memory cell in FIG. 1, for example, electrons are withdrawn from the floating gate FG by applying a programming voltage between the control gate CG and the drain, whereas in erasing of the memory cell, electron is injected into the floating gate FG by applying an erasing voltage between the control gate CG and the drain. There are some proposals for the scheme for programming and erasing a plurality of nonvolatile memory cells by a single step.

Referring to FIG. 2, a first proposal of EEPROMs called FLOTOX (floating gate tunnel oxide) is such that a plurality of word lines WL and a corresponding number of source lines SL are provided in combination for respective rows of the memory cells, whereas a gate line GL and eight bit lines BL are provided in combination for each eight columns of memory cells, such as memory cells M40 to M47. For simplicity, only one byte of memory cells which have a similar configuration are shown in the drawing.

The EEPROM has a byte selection transistor Tr14 for each byte, or memory cells M40 to M47, and each memory cell has therein a cell selection transistor Tr13 and a cell transistor Tr15 having a FLOTOX structure for storage of data. Each of transistors Tr13, Tr14 and Tr15 is implemented by an n-channel transistor.

The cell selection transistor Tr13 of each memory cell has a gate connected to a word line WL, and a source-drain path connected between the bit line BL and the drain of the cell transistor Tr15. The byte selection transistor Tr14 has a gate connected to the word line WL, and a source-drain path connected between the gate line GL and the control gate of the cell transistor Tr15. The cell transistor Tr15 has a source connected to the common source line SL disposed for each byte of the cell transistors M40 to M47. The cell transistor Tr15 has a thin gate oxide film disposed between the floating gate FG and the semiconductor substrate for enabling programming and erasing by a tunnel effect of electrons from/ into the floating gate.

FIGS. 3 to 5 show three different modes of eight memory cells M40 to M47 of the EEPROM shown in FIG. 2, including a programming mode, a flash erasing mode and a read mode. FIG. 6 shows applied voltages in each mode of FIGS. 3 to 5, which is effected in an ordinary manner in the EEPROM, i.e., a byte by byte manner.

In the programming mode, as shown in FIGS. 3 and 6, specified bit lines, among bit lines BL1 to BL8, corresponding to selected memory cells which are to be programmed (programmed with "0") are biased at Vpp (15 volts, for example), while the specified word line WL1 is biased at Vpp to turn on the selection transistors Tr13 and Tr14, the specified source line SL1 is open or floated, and the gate line GL is biased at zero volt. As a result, the electrons stored on the floating gates FG are withdrawn to thereby program the selected memory cells with "0". For memory cells to be erased (or programmed with "1") and memory cells not selected at this time, the corresponding bit lines among bit lines BL1 to BL8 are biased at zero volt, whereby these memory cells are erased or remains in the previous state. At this stage, word lines corresponding to the unselected memory cells are biased at zero volt.

In the flash erasing mode, as shown in FIGS. 4 and 6, the bit lines BL1 to BL8 are biased at 1 volt, while the specified word line WL1 is biased at Vpp to turn on the selection transistors Tr13 and Tr14, the source line SL 1 is floated, and the gate line are biased at Vpp. As a result, electrons are injected into the floating gates of selected memory cells for flash erasing. In this stage, the gate lines and word lines for unselected memory cell groups are biased at zero volt.

In the read mode, as shown in FIGS. 5 and 6, specified bit lines corresponding to the selected memory cells among bit lines BL1 to BL8 are biased at 1 volt, while the specified word line WL1 is biased at Vdd to turn on selection transistors Tr13 and Tr14, and specified source line SL1 and gate line GL are biased at zero volt. As a result, the electrons on the floating gates of selected memory cells can be detected through the bit lines BL1 to BL8 for judging a programmed state or an erased state for each of the selected memory cells. At this stage, bit lines corresponding to unselected memory cells are floated, whereas the gate lines corresponding to the unselected memory cells may be at zero volt or may be about 1 to 2 volts.

In the first proposal, there is a disturbance between the source and the floating gate because the source of the cell transistor Tr15 is directly connected to the common source line disposed for the memory cells M40 to M47. In the programming mode wherein electrons are withdrawn from the floating gate by applying a programming voltage to the drain of the cell transistor Tr15, the cell transistor Tr 15 assumes a depletion state wherein the threshold voltage of the cell transistor Tr15 is below zero volt. This causes a potential rise of the source of the cell transistor Tr15 up to |Vtm|, which enters to the sources of other cell transistors of unselected memory cells via the source line SL. As a result, the disturbance is caused wherein the electrons stored in the floating gates FG of the other cell transistors are withdrawn by the positive voltage |vtm| of the sources to lose the stored data in the unselected memory cells.

A second proposal, which is described in Patent Publication JP-A-7-288291, is such that the memory cell has a single layer gate structure. The proposed EEPROM uses a Fowdler-Nordheim tunnel effect, similarly to the first proposal, for injecting/withdrawing electrons between the floating gate and the drain. Referring to FIG. 7, the proposed EEPROM has a plurality of word lines WL and a corresponding number of program lines PL disposed in combination for respective rows of memory cells, such as memory cells M30 to M37, and a selecting circuit for selecting memory cells specified by is address signals among the memory cells. Eight bit lines BL and a drain-gate line DGL, which functions as a common bit line for a byte of memory cells, are provided for each byte including eight memory cells M30 to M37.

Each of memory cells M30 to M37 has a selection transistor Tr11 and a cell transistor Tr12, both of which are n-channel MOSFETs.

The selection transistor Tr11 has a gate connected to a corresponding word line WL, and a source-drain path connected between a corresponding bit line BL and the source of the cell transistor Tr12. The cell transistor Tr12 has a drain and a control gate CG both connected to the drain-gate line 34. A part of the floating gate FG extending from the cell transistor tr12 forms a capacitive coupling between the same and a diffused region called a program area Pt.

FIG. 8 shows applied voltages in each mode of the EEPROM of FIG. 7, wherein programming, flash erasing and read modes are effected byte by byte. In the programming mode, the bit line BL for selected memory cells are floated, while the word line WL is biased at zero volt to turn off the selection transistor Tr11, the program line PL is biased at Vpp (15 volts, for example), and the drain-gate line DGL is biased at zero volt. As a result, stored charge is withdrawn from the program area Pt, whereby the selected memory cells are programmed. At this stage, unselected memory cells remains in the previous state by biasing the corresponding drain-gate line DGL at Vpp/2.

In the flash erasing mode, all the bit lines BL are floated while the specified word line WL is biased at zero volt to turn off the selection transistor Tr11, the program line PL is biased at zero volt, and the drain-gate line DGL is biased at Vpp. As a result, electrons are injected into each program area Pt for flash erasing.

In the read mode, the specified bit lines BL corresponding to the selected memory cells are biased at 1 volt, while the specified word line WL is biased at Vdd (5 volts, for example) to turn on the selection transistor Tr1, and the program line PL and the drain-gate line DGL are biased at zero volt. As a result, the electrons stored in the program area Pt are detected through the bit lines BL for judging the cell data.

In the second proposal, the drain of the cell transistor Tr12 and the program area Pt are driven by the drain-gate line DGL and the program line PL, which function as common bit lines. Thus, in the programming/erasing of selected cell transistors Tr12, there is a possibility that the drains and the program areas Pt of cell transistors of unselected memory cells may be also driven by the common bit lines to cause a disturbance similarly to the first proposal.

SUMMARY OF THE INVENTION

In view of the above, it is an object of the present invention to provide a nonvolatile semiconductor memory device which is capable of preventing a disturbance between adjacent memory cells.

The present invention provides, in a first aspect thereof, a nonvolatile semiconductor memory device comprising: a semiconductor substrate, a memory cell array including a plurality of nonvolatile memory cells each including a cell transistor having source and drain regions on the semiconductor substrate, and a floating gate and a control gate each disposed in association with the source and drain regions, and a program area formed on a portion of the semiconductor substrate underlying a part of the floating gate; a plurality of word lines each disposed for a corresponding row of the nonvolatile memory cells; a plurality of bit lines each disposed for a corresponding column of the nonvolatile memory cells; a first selection transistor disposed for each group of the cell transistors for responding to selection of a corresponding one of the word lines to apply a first fixed voltage to the drains and the control gates of a corresponding group of the cell transistors; a second selection transistor for responding to the selection of the corresponding one of the word lines to apply a second fixed voltage to the program area; and a third selection transistor disposed for each the cell transistor for responding to the selection of the corresponding one of the word lines to apply the first fixed voltage to the source of the cell transistor.

The present invention also provides, in a second aspect thereof, a nonvolatile semiconductor memory device comprising: a semiconductor substrate, a memory cell array including a plurality of nonvolatile memory cells each including a cell transistor having source and drain regions on the semiconductor substrate, and a floating gate and a control gate each disposed in association with the source and drain regions, and a program area formed on a portion of the semiconductor substrate underlying a part of the floating gate; a plurality of word lines each disposed for a corresponding row of the nonvolatile memory cells; a plurality of bit lines each disposed for a corresponding column of the nonvolatile memory cells; a first selection transistor disposed for each group of the cell transistors for responding to selection of a corresponding one of the word lines to apply a first fixed voltage to the drains of a corresponding group of the cell transistors; a second selection transistor disposed for the each group of the cell transistors for responding to the selection of the corresponding one of the word lines to apply a second fixed voltage to the control gates of the group of the cell transistors, a third selection transistor disposed for each the cell transistor for responding to the selection of a corresponding one of the word lines to apply a third fixed voltage to the program area, and a fourth selection transistor disposed for the corresponding one of the cell transistor to apply the second voltage to the source of the cell transistor.

In accordance with the nonvolatile semiconductor memory device of the present invention, the first through third selection transistors or first through fourth selection transistors function for separation of the source-drain path and the control gate of the cell transistor in the selected memory cell from those of the cell transistors in other unselected memory cells in each group of memory cells, whereby disturbance between memory cells can be suppressed.

The above and other objects, features and advantages of the present invention will be more apparent from the following description, referring to the accompanying drawings.

BRIEF DESCRIPTION OF THE DRAWINGS

FIG. 18 is a table for applied voltages in the flash EEPROM of FIG. 13 during respective modes.

PREFERRED EMBODIMENTS OF THE INVENTION

Figure 1:
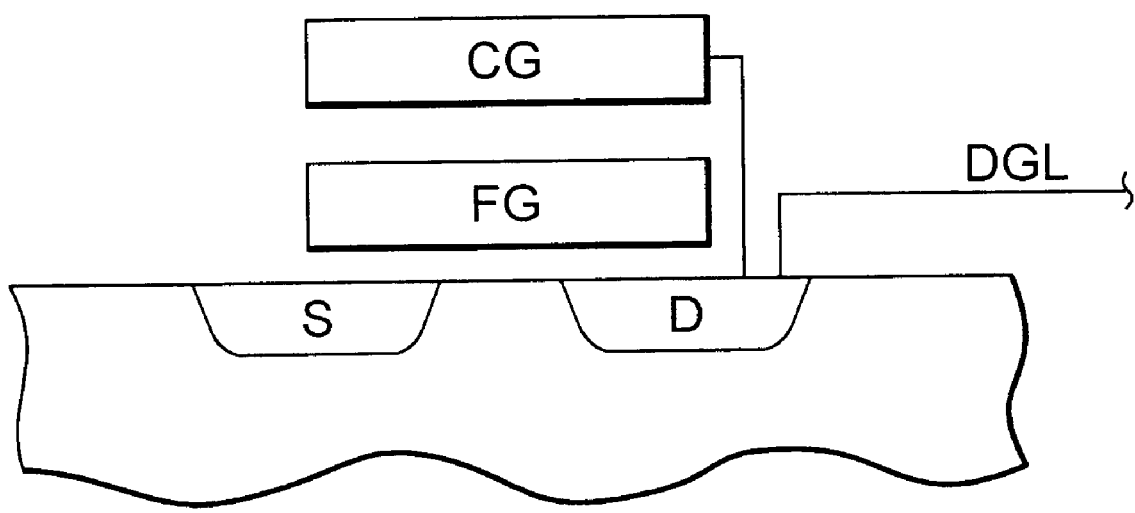
FIG. 1 is a sectional view of a memory cell in a typical flash EEPROM having a double layer gate structure.

Now, the present invention is more specifically described with reference to accompanying drawings, wherein similar constituent elements are designated by similar reference numerals.

Figure 9:
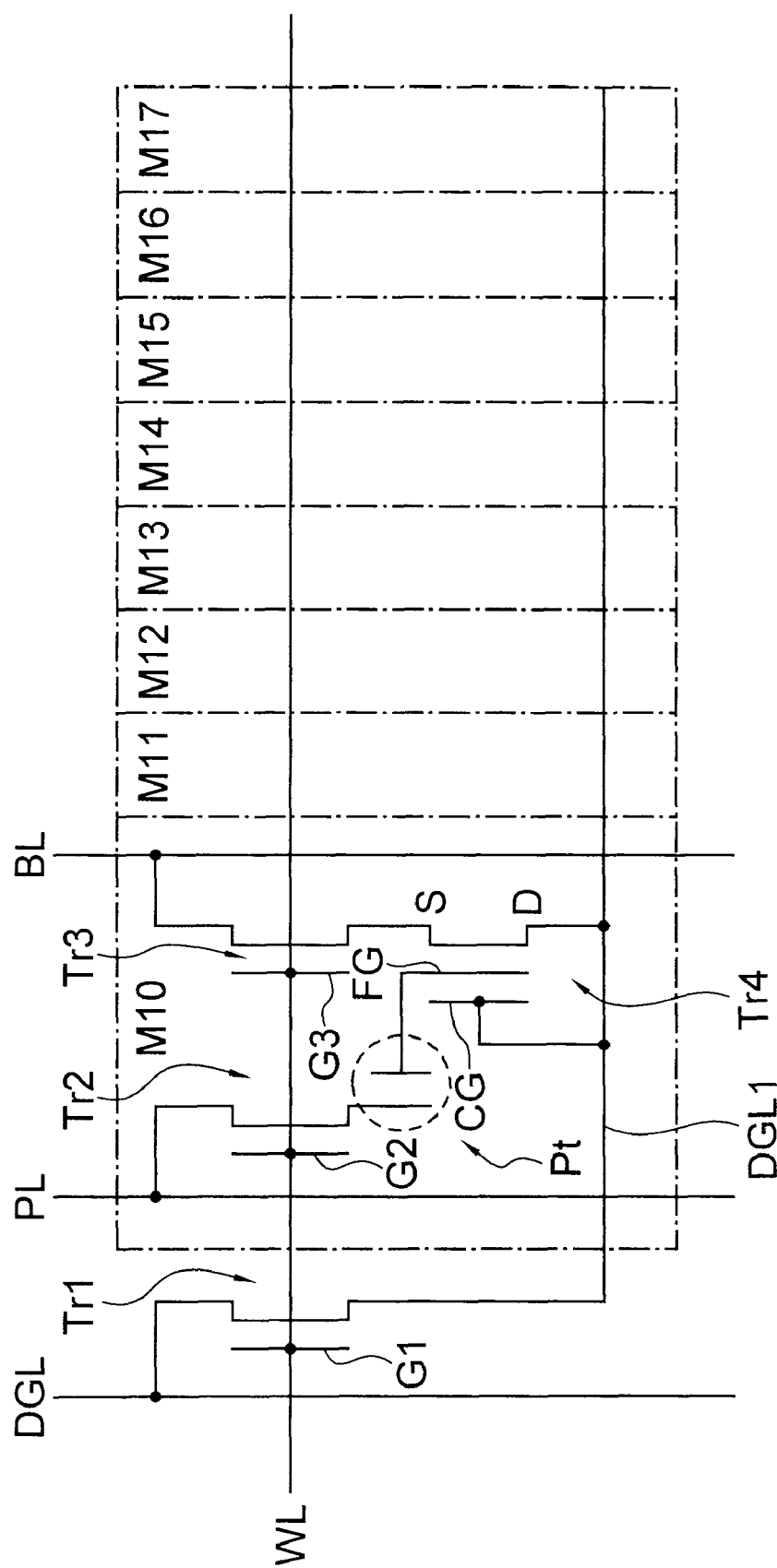
FIG. 9 is a schematic circuit diagram of a flash EEPROM according to a first embodiment of the present invention.

Referring to FIG. 9, a flash EEPROM according to a first embodiment of the present embodiment includes a memory cell array including a plurality of nonvolatile memory cells arranged in a matrix, wherein only one byte of the memory cell group including memory cells M10 to M17 is shown in the figure for simplicity. The flash EEPROM further includes a word line WL disposed for each row of the memory cells, a drain-gate line DGL disposed for each eight columns of the memory cells, such as including the column corresponding to each of memory cells M10 to M17, and a bit line BL and a program line PL disposed in combination for each column of the memory cells so as to couple selected memory cells to a selection circuit not shown. The selection circuit selects memory cells specified by address signals among all the memory cells in the memory cell array.

The EEPROM includes a cell transistor Tr4 in each memory cell having source "S", drain "D", floating gate "EG" and control gate "CG", a first selection transistor (drain-gate selection transistor) Tr1 for selecting gates and drains of the cell transistors Tr4 in each byte of memory cells M10–M17 in each row, a second selection transistor (program area selection transistor) Tr2 disposed in each memory cell for selecting a corresponding program area Pt, and a third selection transistor (source selection transistor) Tr3 disposed in each memory cell for selecting the source of a corresponding cell transistor Tr4.

These transistors Tr1 to Tr4 are nMOSFETs.

The gates G1–G3 of the first through third selection transistors Tr1, Tr2 and Tr3 are connected to a corresponding word line WL. The first selection transistor Tr1 has a source-drain path connected between the drain-gate line DGL and a common coupling line DGL1 which is connected to the control gates and the drains of the cell transistors Tr4 in each byte of memory cells, such as memory cells M10 to M17. The second selection transistor Tr2 has a source-drain path connected between the program line PL and the program area Pt. The third selection transistor Tr3 has a source-drain path connected between the bit line BL and the source of the cell transistor Tr4. The drain of the cell transistor Tr4 is connected to the common coupling line DGL1, and a portion of the floating gate FG of the cell transistor Tr4 opposes an extended part of the diffused region of the second selection transistor Tr2 to define the program area Pt.

Figure 10:
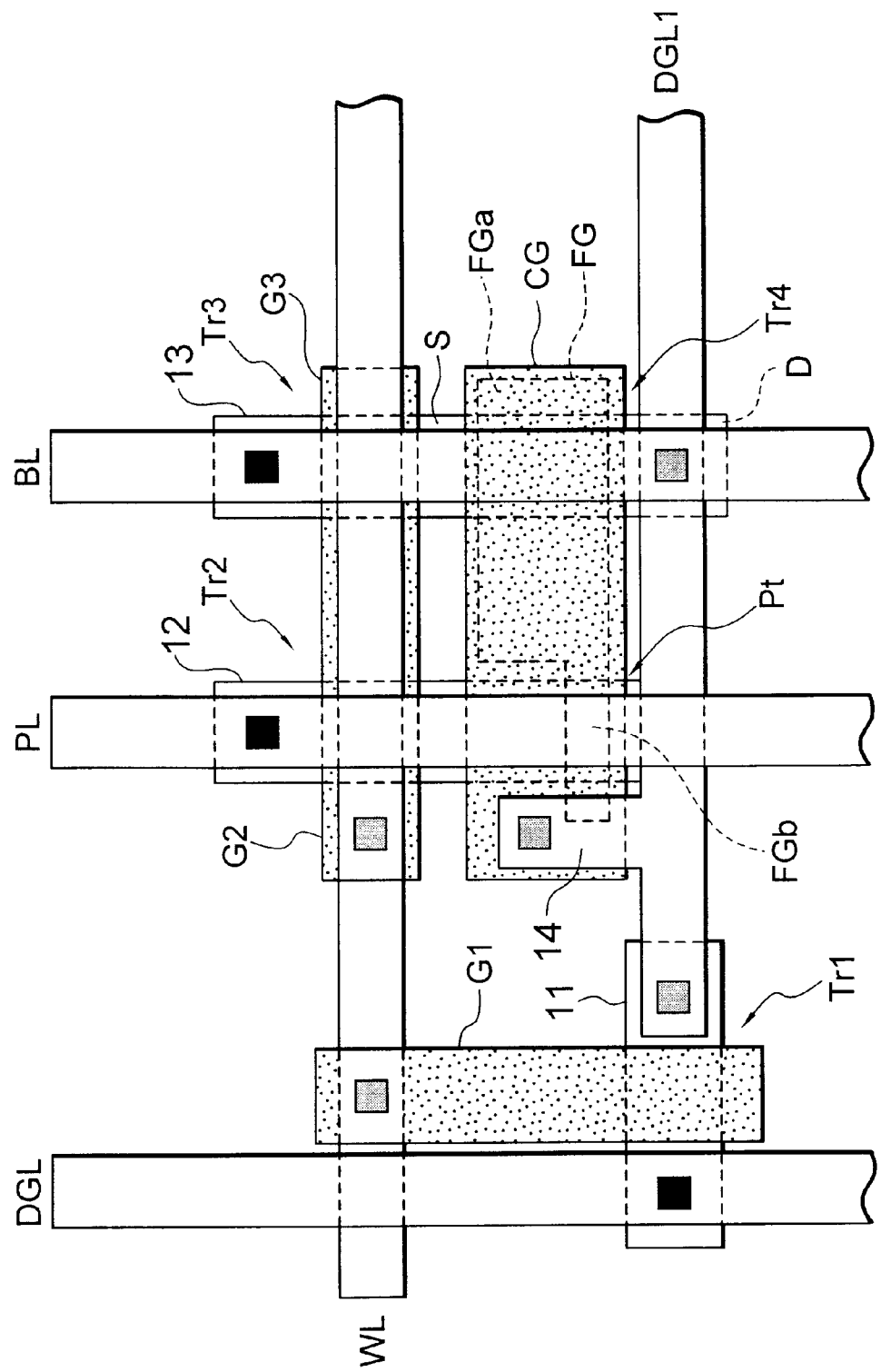
FIG. 10 is a top plan view of the flash EEPROM of FIG. 9.

Referring to FIG. 10 showing a top plan view for the part of the flash EEPROM shown in FIG. 9, the word line WL extending in the row direction is made from a first aluminum layer. The drain-gate line DGL, the program line PL and the bit line BL extending in the column direction in spaced relationship therewith are made from a second aluminum layer. The common coupling line DGL1 extending in the row direction is also made from the first aluminum layer in spaced relationship with the word line WL.

On the surface of the semiconductor substrate, a diffused area 11 including source/drain regions extends in the row direction for coupling the drain-gate line DGL and the program line PL. The first selection transistor Tr1 has a gate G1 made from a second layer polysilicon film overlying the central area of the diffused area 11. The gate G1 extends from the first selection transistor Tr1 and is connected to the word line WL via through-hole.

On the surface region of the semiconductor substrate, diffused areas 12 and 13 underlying the word line WL extend in the column direction. The second selection transistor Tr2 has a gate G2 overlying a first part of the diffused area 12, whereas the third selection transistor Tr3 has a gate G3 overlying a first part of the diffused area 13. The gates G2 and G3 are made from a common polysilicon film and connected together. The double gate structure including the floating gate FG and the control gate CG extend above second parts of the diffused areas 12 and 13 in the vicinity of the common coupling line DGL1. The cell transistor Tr4 is implemented by the second part of the diffused area 13 and a wide end portion FGa of the floating gate FG. The program area Pt is implemented by the second part of the diffused area 12 and the narrow end portion FGb of the floating gate FG.

Figures 11, 12:
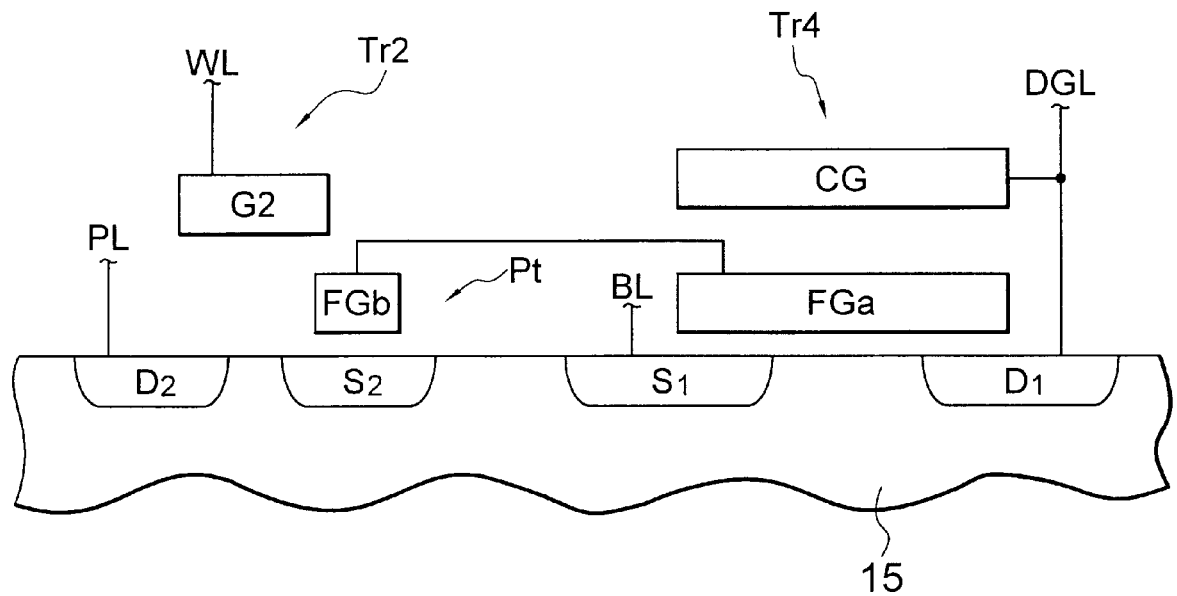
FIG. 11 is a schematic sectional view of the flash EEPROM of FIG. 9.
FIG. 12 is a table for applied voltages in the flash EEPROM of FIG. 9 during programming, erasing and read modes thereof.

FIG. 11 schematically shows the circuit arrangement implemented by the structure of FIG. 10. The control gate CG overlies the wide end portion FGa, which in turn overlies the source region S1 and the drain region D1 of the semiconductor substrate for implementing the cell transistor Tr4. The gate G2 overlies the source region S2 and the drain region D2 of the semiconductor substrate for implementing the second selection transistor Tr2. The narrow end portion FGb of the floating gate also overlies the source region S2 of the second selection transistor Tr2 for implementing the program area Pt. It is shown that the drain region D1 and the control gate CG of the cell transistor Tr4 are connected to the drain-gate line DGL whereas the drain region D2 of the second selection transistor Tr2 is connected to the program line PL.

FIG. 12 shows applied voltages during each mode of the EEPROM of FIG. 9. Each of the programming, flash erasing and read modes is effected byte by byte. In the programming mode, the specified word line WL is biased at Vpp (15 volts, for example) to turn on the first through third selection transistors Tr1, Tr2 and Tr3. At this stage, the drain-gate line DGL and the specified bit lines BL corresponding to the selected memory cells are biased at zero volt whereas the specified program lines PL corresponding to the selected memory cells are biased at Vpp. Thus, the stored electrons are withdrawn from the floating gate FG in the selected memory cells for programming. In the unselected memory cells, the program line PL is biased at zero volt for maintaining the previous state.

In the flash erasing mode, the specified word line WL is biased at Vpp to turn on the first through third selection transistors Tr1, Tr2 and Tr3. At this stage, the drain-gate line DGL and all the bit lines BL in the byte are biased at Vpp whereas all the program lines PL are biased at zero volt. Thus, electrons are injected into the program area for flash erasing.

In the read mode, the specified word line WL is biased at Vdd (5 volts, for example), the drain-gate line DGL and the specified bit lines BL corresponding to the selected memory cells are biased at zero volt, and the specified program line PL corresponding to the selected memory cells are biased at 1 volt. Thus, the electrons in the program area Pt are detected for read-out of the stored data in the selected memory cells.

Figure 2:
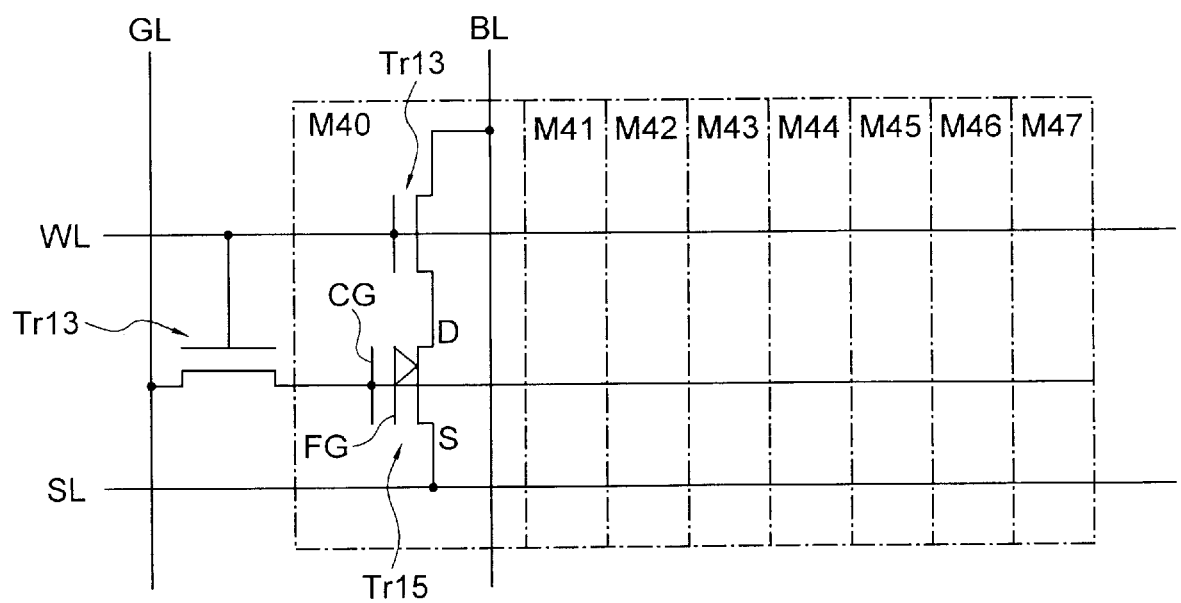
FIG. 2 is a schematic circuit diagram of a conventional flash EEPROM.
Figure 3:
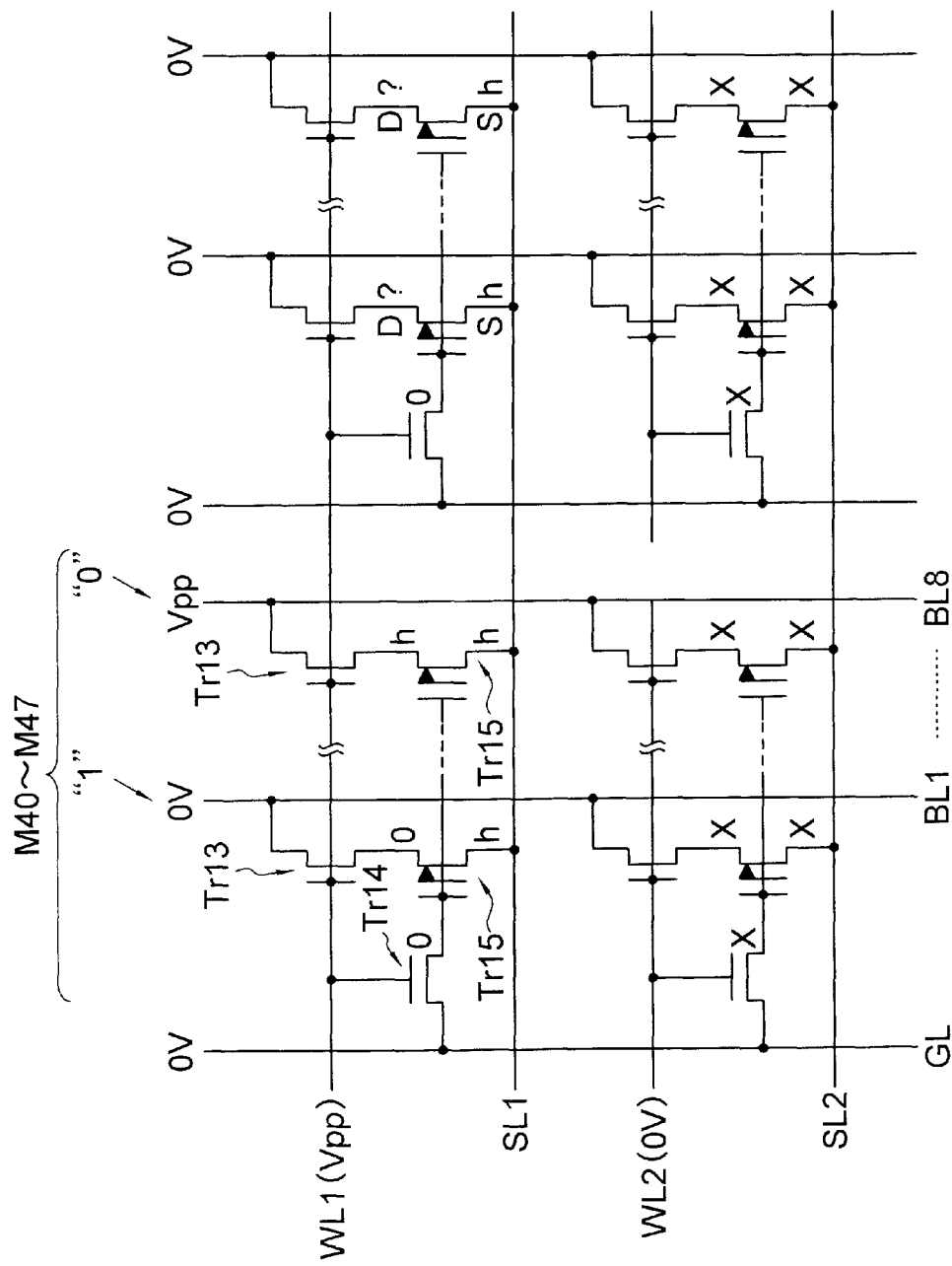
FIGS. 3 to 5 are schematic circuit diagrams of the flash EEPROM of FIG. 2 during programming, flash erasing and read modes, respectively.
Figure 4:
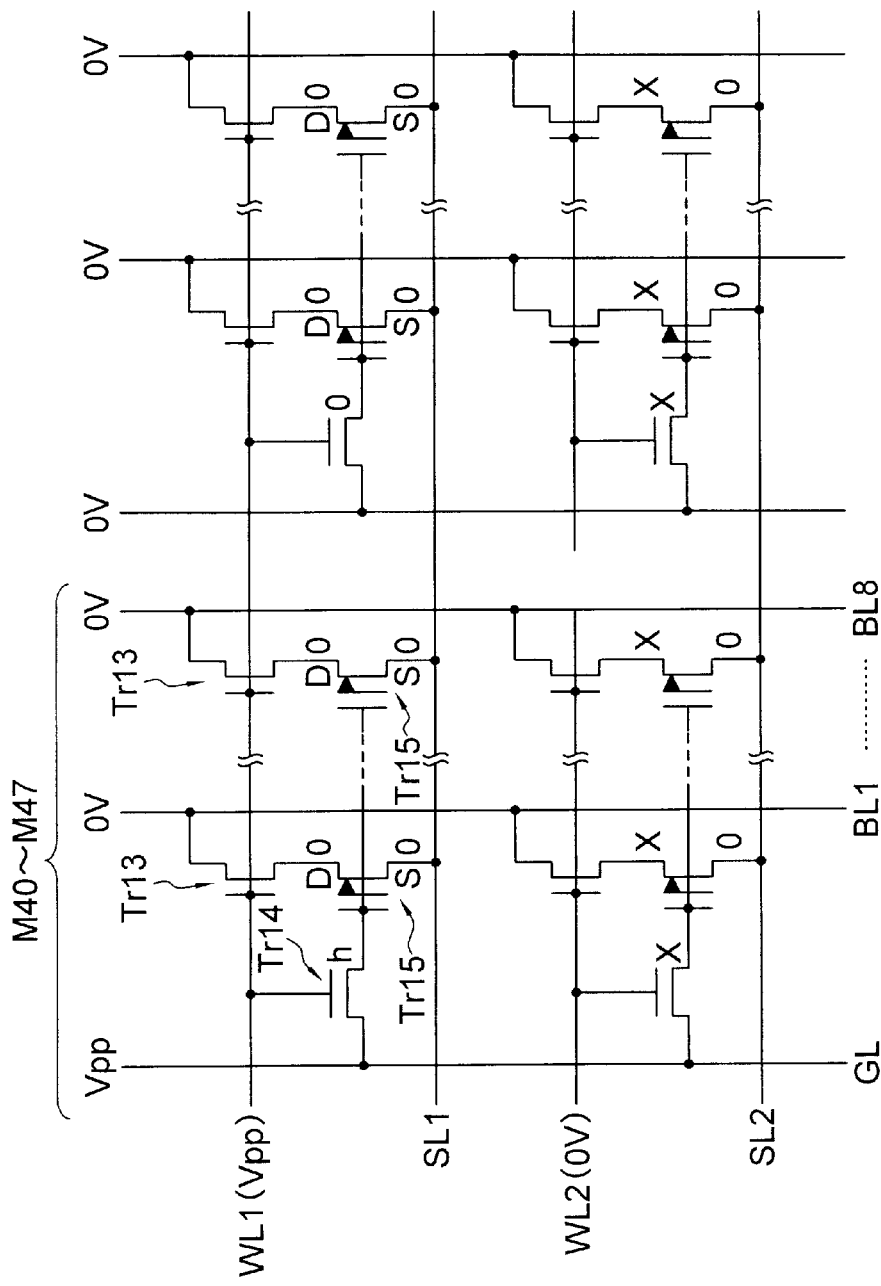
Figure 5:
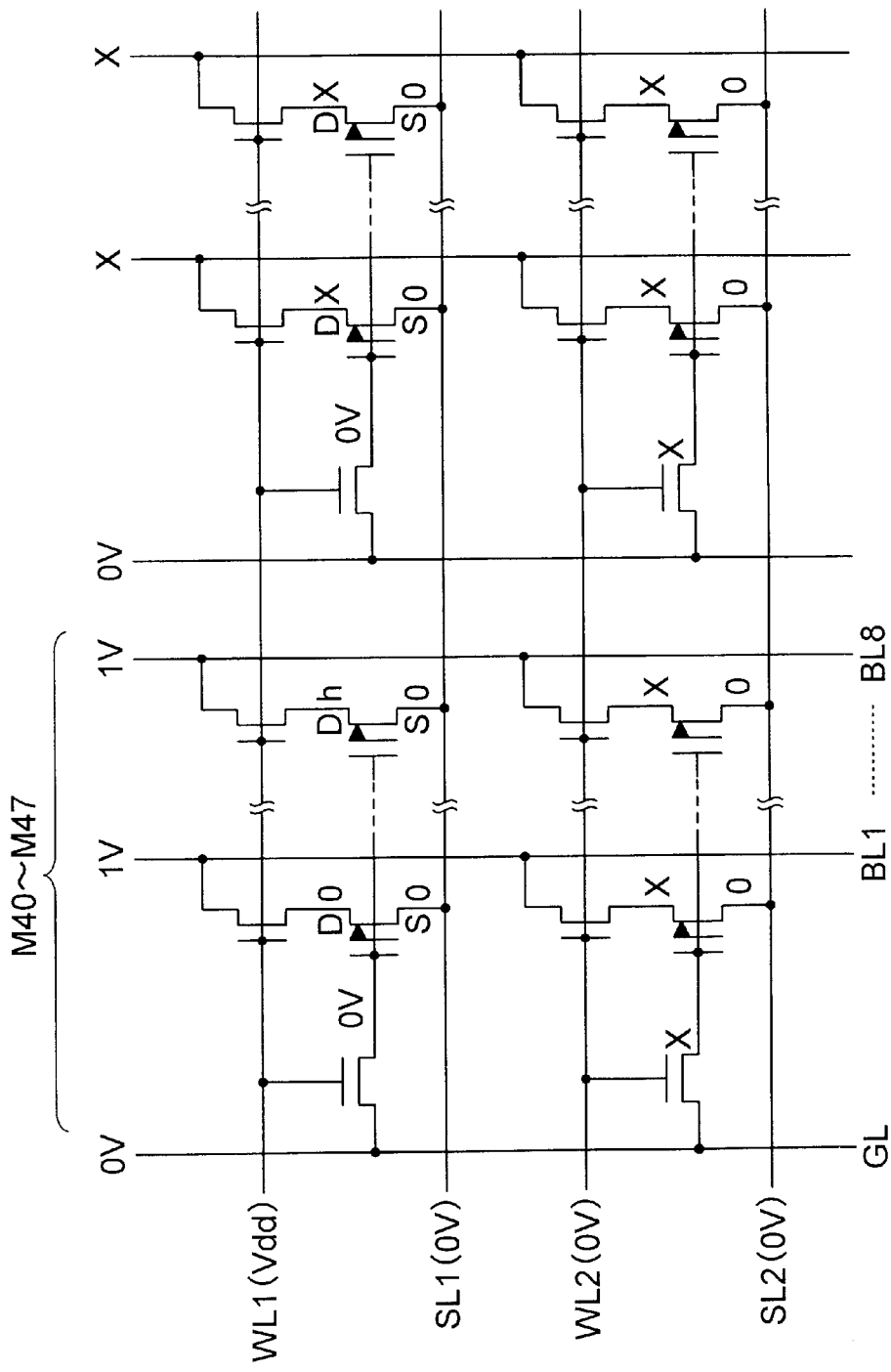
Figures 6, 7, 8:
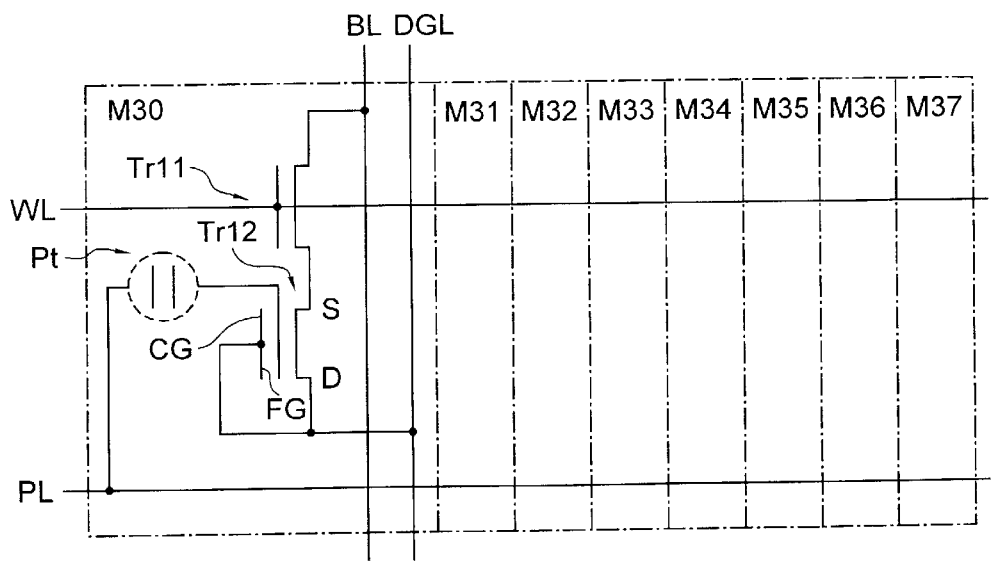
FIG. 6 is a table of applied voltages in the flash EEPROM of FIG. 2 during respective modes.
FIG. 7 is a schematic circuit diagram of another conventional flash EEPROM having a single layer gate structure.
FIG. 8 is a table for applied voltages in the flash EEPROM of FIG. 7 during respective modes.

As described above, in the EEPROM of the present embodiment, the first through third selection transistors Tr1 to Tr3 function for disconnecting the source, drain and the control gate of the cell transistor Tr4 from the program line PL and the drain-gate line DGL, which function as common bit lines in the byte of columns. In these configurations, by biasing the drain of the cell transistor Tr4 at zero volt and biasing the floating gate also at zero volt by a capacitive coupling in the programming mode, the electrons stored in the program area Pt can be withdrawn through the program line PL. By biasing the drain of the cell transistor Tr4 at Vpp and biasing the floating gate thereof at Vpp by a capacitive coupling in an erasing mode, electrons can be injected into the program area Pt. Thus, since the program areas for the unselected memory cells are not applied with a bias voltage, which is equivalent to fixing the drain voltage of the selection transistor Tr14 in the conventional EEPROM of FIG. 2, the disturbance can be suppressed between the memory cells caused by break-in of the potential of the other memory cells in either the programming mode or the erasing mode.

Figure 13:
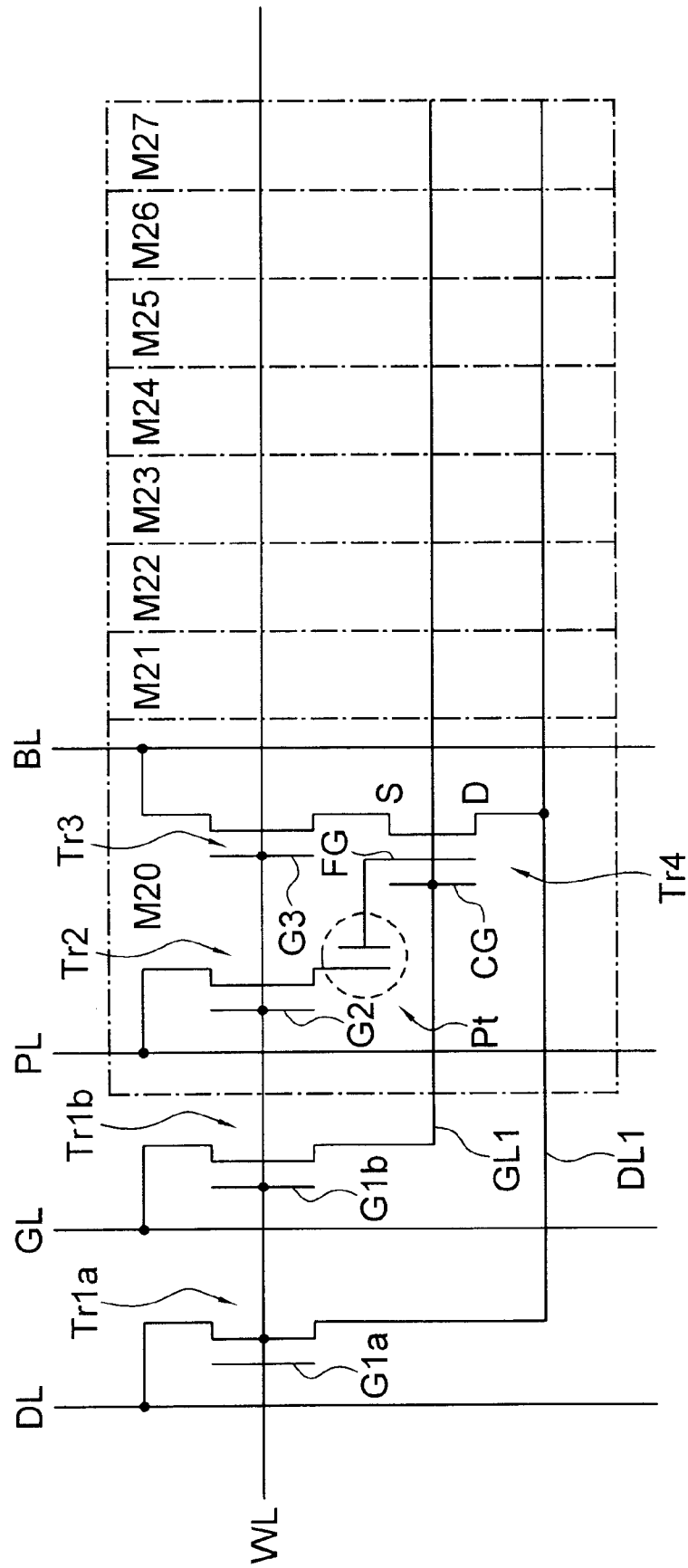
FIG. 13 is a schematic circuit diagram of a flash EEPROM according to a second embodiment of the present invention.

Referring to FIG. 13, a flash EEPROM according to a second embodiment of the present invention is similar to the first embodiment except that the flash EEPROM of the present embodiment has a drain line DL and a drain selection transistor Tr1a outside each memory cell separately from a gate line GL and a gate selection transistor Tr1b, respectively.

The gate G1a of the drain selection transistor Tr1a, the gate G1b of the gate selection transistor G1a, the gate G2 of the program area selection transistor Tr2 and the gate G3 of the source selection transistor Tr3 are connected to a corresponding word line 41. The drain selection transistor Tr1a has a source-drain path connected between the drain line DL and the drain coupling line DL1, which is connected to the drains of the memory cells M20 to M27 in the byte. The gate selection transistor Tr1b has a source-drain path connected between the gate line GL and the gate coupling line GL1, which is connected to the gates of the memory cells M20 to M27 in the byte.

Figure 14:
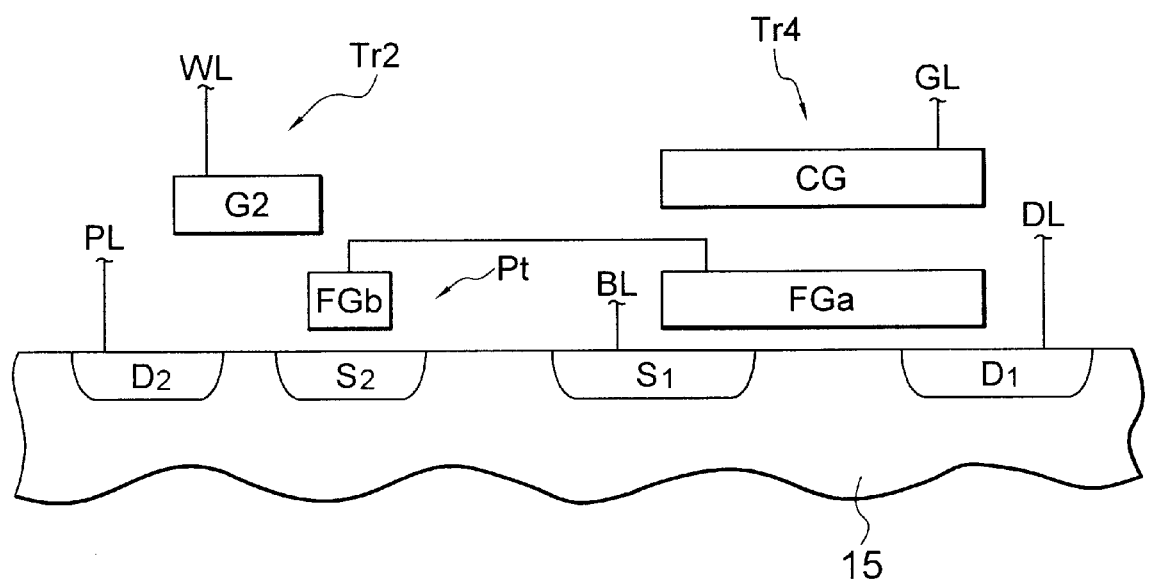
FIG. 14 is a schematic sectional view of the flash EEPROM of FIG. 13.

Referring to FIG. 14 showing the flash EEPROM of FIG. 13 similarly to FIG. 11, the control gate CG of the cell transistor Tr4 is connected to the gate line GL whereas the drain D1 of the cell transistor Tr4 is connected to the drain line DL. Other configurations are similar to those shown in FIG. 11.

Figure 15:
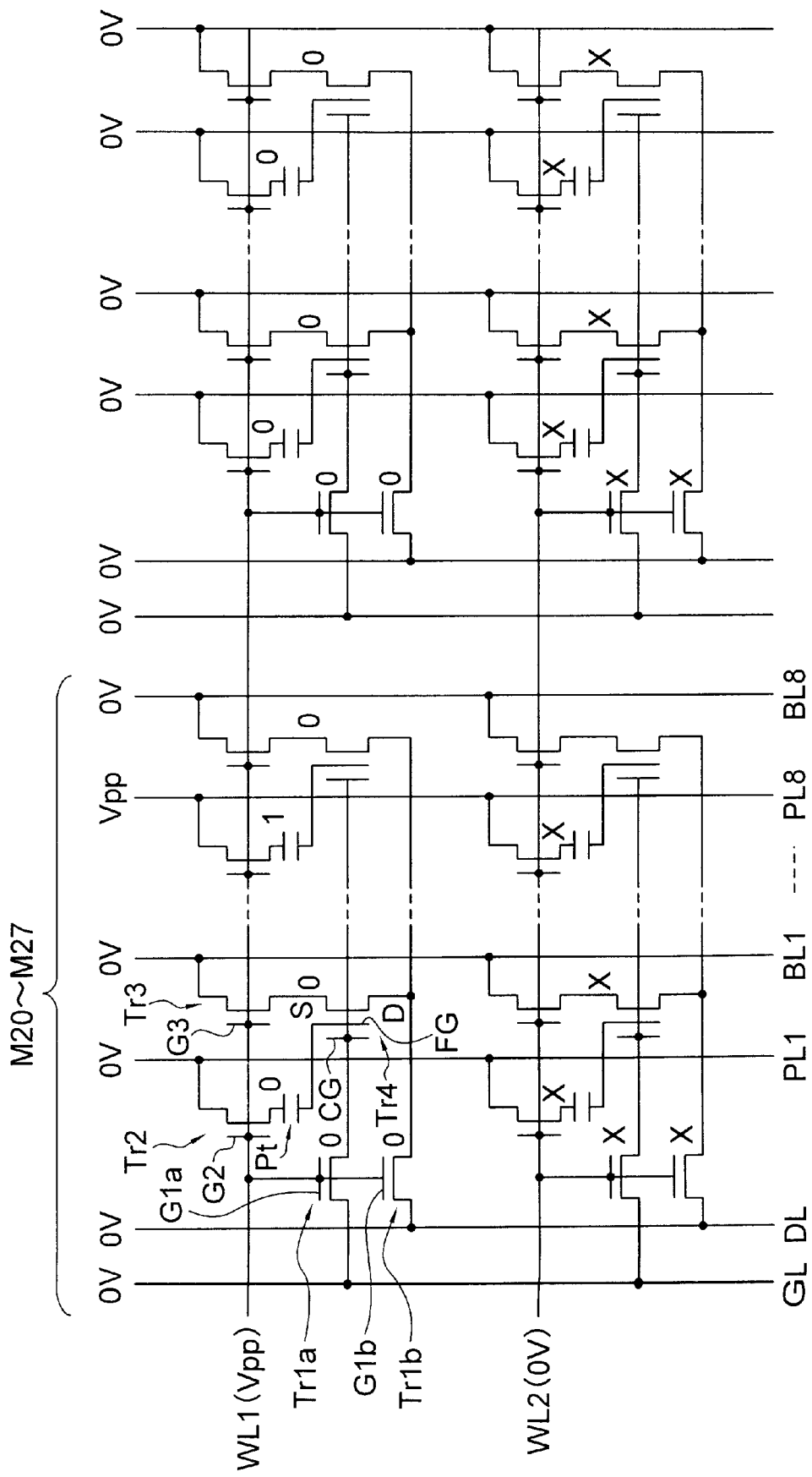
FIGS. 15 to 17 are schematic circuit diagrams of the flash EEPROM of FIG. 13, during programming, erasing and read modes, respectively.
Figure 16:
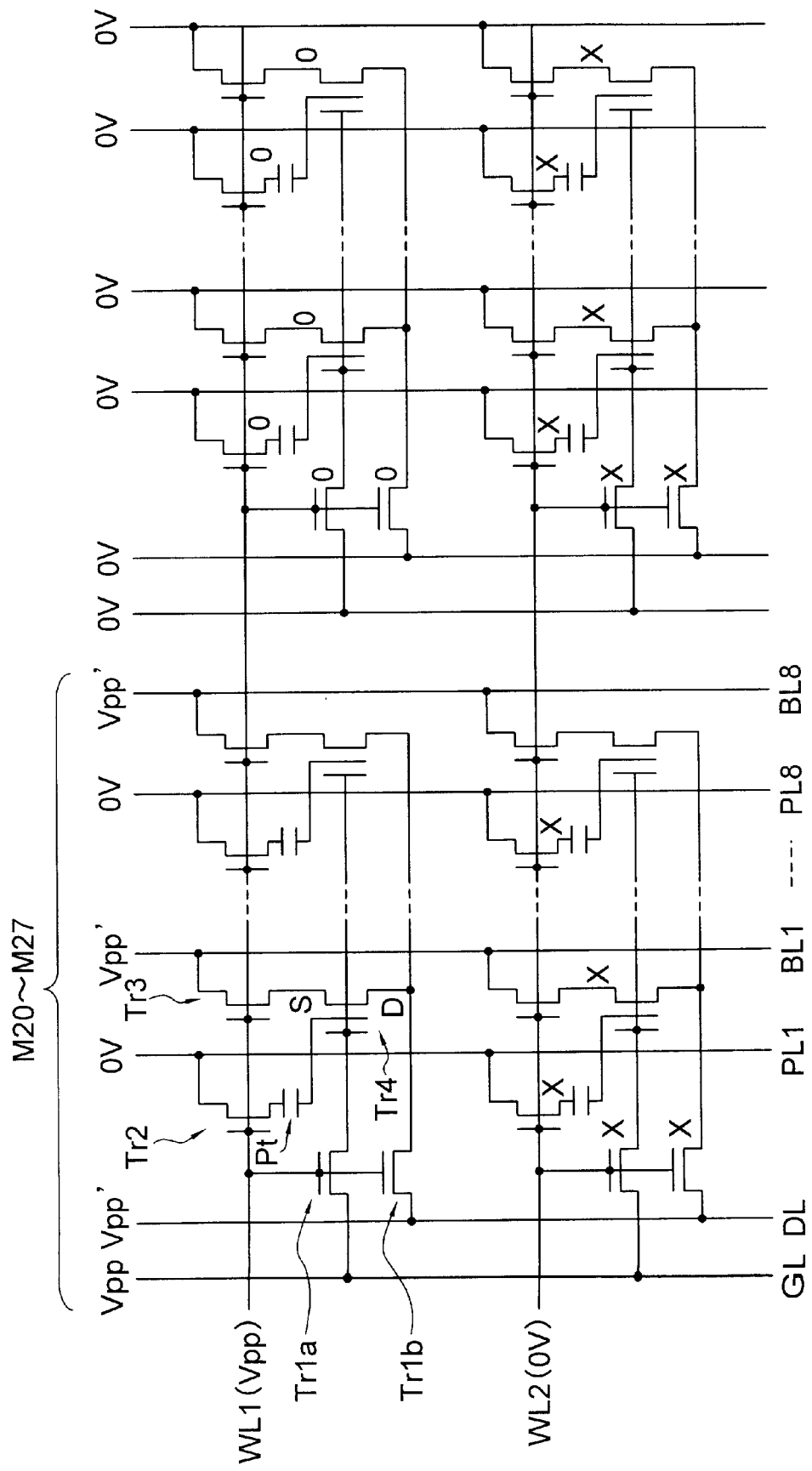
Figure 17:
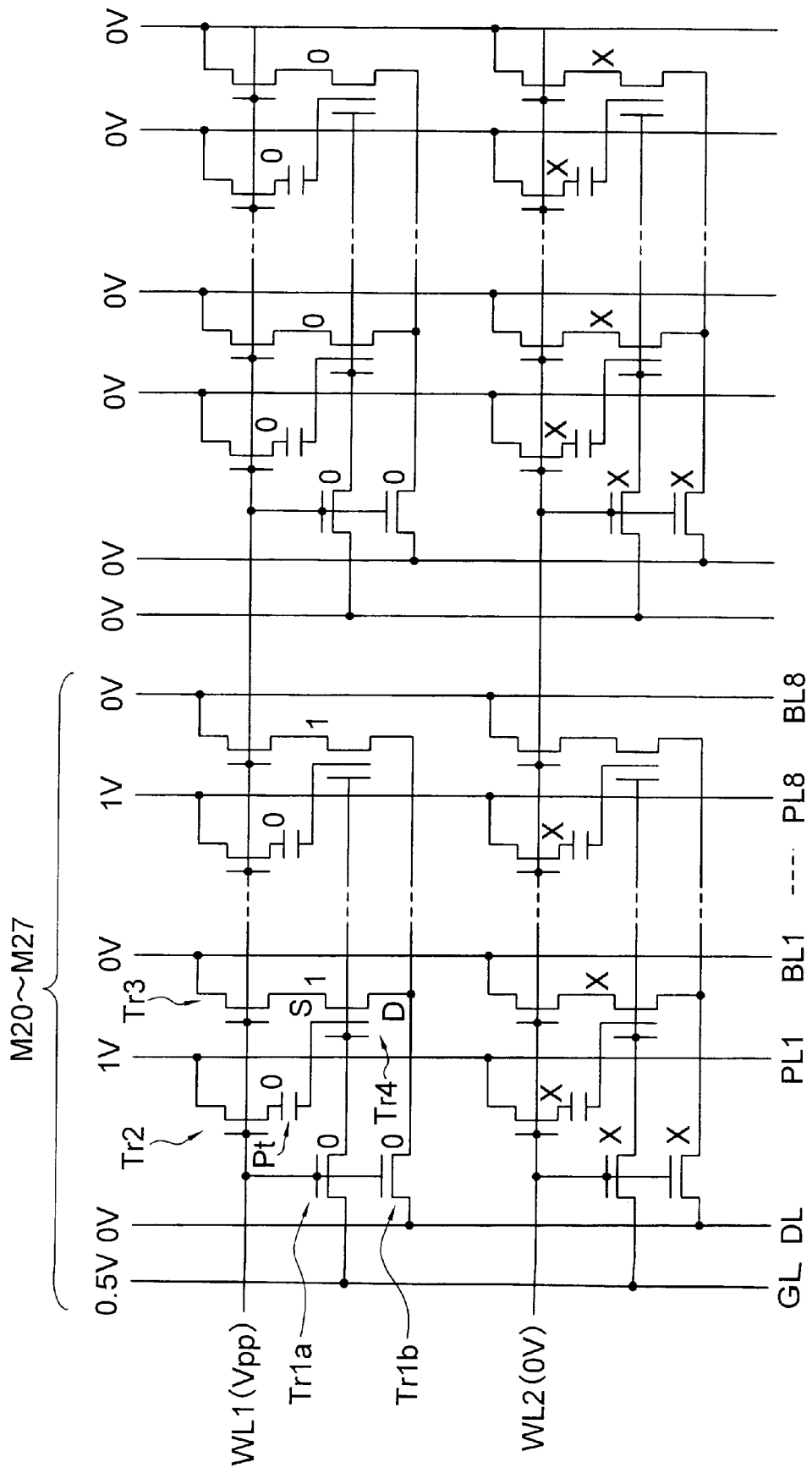

FIGS. 15 to 17 show circuit diagrams in programming, erasing and read modes, respectively, in the EEPROM of FIG. 13, wherein two of the rows of the memory cells and two of the columns of the memory cells are shown in the respective figures. In each byte of the memory cells, the gate selection transistor Tr1a has a gate G1a connected to a corresponding word line WL1 or WL2, and a source-drain path connected between the gate line GL and the control gates CG of the cell transistors Tr4 in the byte. The drain selection transistor Tr1b has a gate G1b connected to a corresponding word line WL1 or WL2, and a source-drain path connected to the drain line DL and the drains of the cell transistors Tr14 in the byte. The program area selection transistor Tr2 in each memory cell has a gate G2 connected to a corresponding word line WL1 or WL2, and a source-drain path connected between a corresponding program line PL1, PL2, ... or PL8 and a corresponding program area Pt. The source selection transistor Tr3 in each memory cell has a gate G3 connected to a corresponding word line WL1 or WL2, and a source-drain path connected between a corresponding bit line BL1, BL2, ... or BL8 and the source of the cell transistor Tr4. The floating gate FG of the cell transistor Tr4 extends from the cell transistor Tr4 to oppose an extending portion of the source of the program area selection transistor Tr2, thereby forming the extending portion as a program area Pt.

FIG. 18 shows applied voltages in each mode in the EEPROM of FIG. 13, wherein each mode is effected byte by byte. In the programming mode of FIG. 15, the specified word line WL1 is biased at Vpp to turn on the selection transistors Tr1a, Tr1b, Tr2 and Tr3. At this stage, the drain line DL and the gate line GL in the byte and the specified bit lines among bit lines BL1, BL2, ... and BL7 corresponding to the selected memory cells are biased at zero volt, whereas the specified program lines among program lines PL1, PL2, ... and PL8 corresponding to the selected memory cells to be programmed with "0" are biased at Vpp. Thus, the electrons stored in the corresponding program areas are withdrawn for programming. On the other hand, other program lines corresponding to the selected memory cells to be erased (i.e., programmed with "1") and to the unselected memory cells are biased at zero volt, whereby these memory cells are erased or remains in the previous state. The word line WL2 corresponding to the unselected rows of the memory cells is biased at zero volt, whereby the selection transistors Tr1a, Tr1b, Tr2 and Tr3 are turned off to float the corresponding lines, as denoted by "X" in the figure.

In the flash erasing mode of FIG. 16, the specified word line WL1 is biased to turn on the selection transistors Tr1a, Tr1b, Tr2 and Tr3. At this stage, the drain line DL and all the bit lines BL1 to B18 are biased at Vpp' (12 volts, for example), the gate line GL is biased at Vpp, and all the program lines PL1 to PL8 are biased at zero volt. Thus, electrons are injected into the program areas corresponding to the selected memory cells for flash erasing. At this stage, the bit lines corresponding to the unselected memory cells are biased at zero volt, whereby erasing is not effected in the unselected memory cells.

In the read mode of FIG. 17, the specified word line WL1 is biased at Vdd to turn on the selection transistors Tr13 and Tr14, the drain line DL and specified bit lines corresponding to the selected memory cells are biased at zero volt, the gate line GL is biased at 0.5 volts, and the specified program line corresponding to the selected memory cells are biased at 1 volt. Thus, the cell date is read-out from the selected memory cells. At this stage, the word lines WL2 and bit lines corresponding to the unselected memory cells are biased at zero volt.

As described above in the second embodiment, selection transistors Tr1a, Tr1b, Tr2 and Tr3 function for separation of source, drain and gate of the cell transistor Tr4 from the program line, drain line DL and the gate line GL, which constitute common bit lines. By these configurations, in the programming mode, the drain of the cell transistor Tr4 is biased at zero volt, and the floating gate FG is biased at zero volt by a capacitive coupling, whereby electrons are withdrawn from the program area Pt to the corresponding program line. In the flash erasing mode, the drain of the cell transistor Tr4 is biased at Vpp' and the floating gate FG is biased at Vpp' by a capacitive coupling, whereby electrons are injected into the program area.

In short, since the voltages for the drain and the control gate of the cell transistor are separately controlled from each other, the disturbance as caused in the conventional EEPROM is suppressed in the programming and erasing modes.

In addition, since the source-drain voltage and the control gate voltage are separately controlled in the cell transistor Tr4 by the separate selection transistors Tr1a and Tr1b, the drain-source voltage Vpp' in the erasing mode can be lower than the control gate voltage Vpp. This affords a lower breakdown voltage in the cell transistor Tr4 and the source selection transistor Tr3, whereby a reduction in design rule can be obtained due to a smaller distance between the drain and the source. This affords a reduction in the occupied area of the flash EEPROM.

Since the above embodiments are described only for examples, the present invention is not limited to the above embodiments and various modifications or alterations can be easily made therefrom by those skilled in the art without departing from the scope of the present invention.

What is claimed is:

1. A nonvolatile semiconductor memory device comprising: a semiconductor substrate, a memory cell array including a plurality of nonvolatile memory cells each including a cell transistor having source and drain regions on said semiconductor substrate, and a floating gate and a control gate each disposed in association with said source and drain regions, and a program area formed on a portion of said semiconductor substrate underlying a part of said floating gate; a plurality of word lines each disposed for a corresponding row of said nonvolatile memory cells; a plurality of bit lines each disposed for a corresponding column of said nonvolatile memory cells; a first selection transistor disposed for each group of said cell transistors for responding to selection of a corresponding one of said word lines to apply a first fixed voltage to the drains and the control gates of a corresponding group of said cell transistors; a second selection transistor for responding to the selection of the corresponding one of said word lines to apply a second fixed voltage to said program area; and a third selection transistor disposed for each said cell transistor for responding to the selection of the corresponding one of said word lines to apply said first fixed voltage to the source of said cell transistor.

2. The nonvolatile semiconductor memory device as defined in claim 1, wherein said first fixed voltage is supplied from a first common bit line provided for each byte column of said memory cells, said second fixed voltage is supplied from a second common bit line disposed for each column of said memory cells.

3. The nonvolatile semiconductor memory device as defined in claim 1, wherein, in a programming mode, the drain and the control gate of said cell transistor is biased at a voltage lower than a bias voltage of the floating gate in each said memory cell.

4. The nonvolatile semiconductor memory device as defined in claim 1, wherein, in flash erasing mode, the drain and the control gate of said cell transistor is biased at a voltage higher than a bias voltage of the floating gate in each memory cell.

5. A nonvolatile semiconductor memory device comprising: a semiconductor substrate, a memory cell array including a plurality of nonvolatile memory cells each including a cell transistor having source and drain regions on said semiconductor substrate, and a floating gate and a control gate each disposed in association with said source and drain regions, and a program area formed on a portion of said semiconductor substrate underlying a part of said floating gate; a plurality of word lines each disposed for a corresponding row of said nonvolatile memory cells; a plurality of bit lines each disposed for a corresponding column of said nonvolatile memory cells; a first selection transistor disposed for each group of said cell transistors for responding to selection of a corresponding one of said word lines to apply a first fixed voltage to the drains of a corresponding group of said cell transistors; a second selection transistor disposed for the each group of said cell transistors for responding to the selection of the corresponding one of said word lines to apply a second fixed voltage to the control gates of said group of said cell transistors, a third selection transistor disposed for each said cell transistor for responding to the selection of a corresponding one of said word lines to apply a third fixed voltage to said program area, and a fourth selection transistor disposed for the corresponding one of said cell transistor to apply said second voltage to the source of said cell transistor.

6. The nonvolatile semiconductor memory device as defined in claim 5, wherein said first fixed voltage is supplied from a first common bit line disposed for each byte column of said memory cells, said second fixed voltage is supplied from a second common bit line disposed for each byte of said memory cells, and said third fixed voltage is supplied from a third common bit line disposed for each column of said memory cells.

7. The nonvolatile semiconductor memory device as defined in claim 5, wherein, in a programming mode, the drain and the control gate of said cell transistor is biased at a voltage lower than a bias voltage of the floating gate in each said cell transistor.

8. The nonvolatile semiconductor memory device as defined in claim 5, wherein, in flash erasing mode, the drain is biased at a voltage higher than a bias voltage of the control gate of said cell transistor, which is higher than a bias voltage of the floating gate in each memory cell.

* * * * *